United States Patent

Mittal et al.

(10) Patent No.: US 9,535,123 B2
(45) Date of Patent: Jan. 3, 2017

(54) FREQUENCY SCALED SEGMENTED SCAN CHAIN FOR INTEGRATED CIRCUITS

(71) Applicant: Texas Instruments Incorporated, Dallas, TX (US)

(72) Inventors: Rajesh Kumar Mittal, Bangalore (IN); Wilson Pradeep, Bangalore (IN); Vivek Singhal, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/985,699

(22) Filed: Dec. 31, 2015

(65) Prior Publication Data

US 2016/0266202 A1    Sep. 15, 2016

(30) Foreign Application Priority Data

Mar. 12, 2015 (IN) .......................... 1226/CHE/2015

(51) Int. Cl.
*G01R 31/3177* (2006.01)
*G01R 31/28* (2006.01)
*G01R 31/317* (2006.01)
*G01R 31/44* (2006.01)

(52) U.S. Cl.
CPC ....... *G01R 31/3177* (2013.01); *G01R 31/2851* (2013.01); *G01R 31/31721* (2013.01); *G01R 31/31725* (2013.01)

(58) Field of Classification Search
CPC ............ G01R 31/3177; G01R 31/2851; G01R 31/31721; G01R 31/31725; G01R 31/318555; G01R 31/318572
See application file for complete search history.

(56) References Cited

U.S. PATENT DOCUMENTS

| 5,526,365 A | 6/1996 | Whetsel |
| 8,627,161 B2 | 1/2014 | Whetsel |
| 2008/0215943 A1* | 9/2008 | Guo ................... G01R 31/3177 714/729 |
| 2010/0332929 A1* | 12/2010 | Branch ............ G01R 31/31853 714/731 |
| 2012/0072793 A1* | 3/2012 | Rao .................. G01R 31/31854 714/719 |

OTHER PUBLICATIONS

"Joint Test Action Group", Wikipedia, available at https://en.wikipedia.org/wiki/Joint_Test_Action_Group on Dec. 22, 2015, pp. 1-15.

* cited by examiner

*Primary Examiner* — Cynthia Britt
*Assistant Examiner* — Dipakkumar Gandhi
(74) *Attorney, Agent, or Firm* — Ronald O. Neerings; Frank D. Cimino (57) ABSTRACT

A scan chain may be formed throughout an integrated circuit in which the scan chain includes at least a first segment and a second segment. A first portion of a test pattern is scanned into the first segment by clocking a first scan cell of the first segment with an even clock while clocking a remainder of the plurality of scan cells in the first segment with an odd clock, in which the odd clock is out of phase with the even clock, in which the even clock and odd clock have a rate equal to a scan rate of the test pattern divided by an integer N. A second portion of the test pattern is scanned into the second segment by clocking the plurality of scan cells in the second segment with the odd clock, such that the second portion of the test pattern is not scanned into the first segment.

12 Claims, 9 Drawing Sheets

FREQUENCY SCALED SEGMENTED SCAN CHAIN FOR INTEGRATED CIRCUITS

CLAIM OF PRIORITY UNDER 35 U.S.C. 119 (a)

The present application claims priority to and incorporates by reference Indian Application number 1226/CHE/2015, filed Mar. 12, 2015, entitled "Novel Mechanism For Scan Power Reduction To Enable Application And Test Time Optimization."

FIELD OF THE INVENTION

This disclosure relates to testing of an integrated circuit, and more particularly to a scan chain with multiple segments clocked by out of phase clocks in order to reduce power dissipation.

BACKGROUND OF THE INVENTION

Scan architectures are commonly used to test digital circuitry in integrated circuits (IC). In automotive devices that must adhere to strict safety regulations, scan chains may be used to perform self-test each time a device is powered on, such as when a vehicle is started. Additional testing may be performed within defined time periods during operation of a device in order to assure correct operation. Self-test time governs the total boot-up time and it should also fit within a specified application time interval during application mode operation. The self-test time is mainly governed by frequency of operation. For instance, consider an IC device with max frequency of 100 MHz and functional worst case switching activity of 25%. In this case, running the scan (1100 pattern sequence) at 100 MHz may cause 50% switching activity and thereby doubles the power consumption. Hence in this case, the max scan frequency may be limited to 50 MHz in order not to exceed power dissipation limits. For a given pattern set, running the tests at 50 MHz as opposed to 100 MHz may double the test-time and application time.

BRIEF DESCRIPTION OF THE DRAWINGS

Particular embodiments in accordance with the invention will now be described, by way of example only, and with reference to the accompanying drawings.

Other features of the present embodiments will be apparent from the accompanying drawings and from the detailed description that follows.

DETAILED DESCRIPTION OF EMBODIMENTS OF THE INVENTION

Specific embodiments of the invention will now be described in detail with reference to the accompanying figures. Like elements in the various figures are denoted by like reference numerals for consistency. In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

Scan architectures are commonly used to test digital circuitry in integrated circuits. The present disclosure describes a method of adapting conventional scan architectures into a low power scan architecture. The low power scan architecture may allow maintaining the test time of conventional scan architectures while requiring significantly less operational power than conventional scan architectures. The low power scan architecture is advantageous to IC/die manufacturers since it allows a larger number of circuits, such as CPU core circuits, embedded in an IC/die to be tested in parallel without consuming too much power within the IC/die. Since the low power scan architecture reduces test power consumption, it is possible to simultaneously test more die on a wafer than previously possible using conventional scan architectures. This allows a wafer test time to be reduced which reduces the manufacturing cost of each die on the wafer. Similarly, self-test times during device boot and during application time intervals may be reduced.

As will be described in more detail below, embodiment of the present disclosure provide a method of frequency scaled segmented (FSS) scan that enables scaling the tester level scan frequency to 2× with two segments and up to NX with N segments with still maintaining the internal design level scan frequency to 1λ. The FSS Scan approach involves data from a test access port decompressor on an integrated circuit being latched by two phased clocks that are 180 degrees out of phase to different segments. The different segments may be operated at a divided clock frequency where clock is divided by two, for example.

Figure 1:
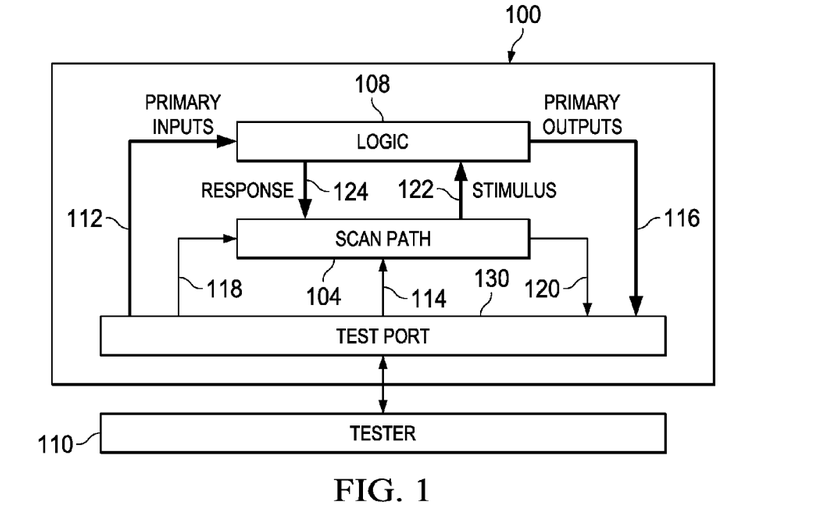
FIG. 1 is a block diagram of a circuit with a scan path.

FIG. 1 illustrates a simplified view of a scan architecture that illustrates how a circuit 100 may be configured into a scan chain during test. In the normal functional configuration, circuit 100 may be a functional circuit within an IC, but in test configuration it appears as shown in FIG. 1. Scan architectures can be applied at various circuit levels. For example, the scan architecture of FIG. 1 may represent the testing of a complete IC, or it may represent the testing of an embedded intellectual property (IP) core sub-circuit within an IC, such as a DSP (digital signal processor) or CPU (central processing unit) core sub-circuit. The scan architecture may include a scan path circuit 104, logic circuitry to be tested 108, and connection paths 112, 114, 116, 118, 120 to a tester 110 via a test port 130. Tester 110 operates to: (1) output control to operate scan path 104 via control path 114; (2) output serial test stimulus patterns to scan path 104 via scan input path 118; (3) input serial test response patterns from scan path 104 via scan output path 120; (4) output parallel test stimulus patterns to logic 108 via primary input path 112; and (5) input parallel test response patterns from logic 108 via primary output path 116. Scan path 104 operates to output parallel test stimulus patterns to logic 108 via path 122, and to input parallel response patterns from logic 108 via path 124.

Typically tester 110 is interfaced to the scan architecture by probing the die pads at wafer level, or by contacting package pins that couple to test port 130 after the die is assembled into a package.

While tester 110 connections to the primary inputs 112 and primary outputs 116 of logic 108 are shown, the primary input and output connections may be achieved by augmentation of scan path 104. For example, scan path 104 could be lengthened to include boundary scan cells located on each primary input and primary output of logic 108. The boundary scan cells would provide primary inputs to and primary outputs from logic 108, via widened stimulus and response busses 122 and 124, respectively. In some instances, logic 108 may be sufficiently tested by scan path 104 such that it is not necessary to provide primary inputs to and outputs from logic 108 via the tester or via the above described augmentation of scan path 104. For example, if the amount of logic 108 circuitry made testable by the use of scan path 104 in combination with the primary inputs and outputs is very small compared to the amount of logic 108 circuitry made testable by the scan path 104 alone, then the primary input and output connections to logic 108 may removed without significantly effecting the test of logic circuitry 108. To simplify the description of the present disclosure, it will be assumed that logic circuit 108 is sufficiently tested using only scan path 104, i.e. the primary inputs 112 and primary outputs 116 are not required. However, it is clear that primary input and output connections to the tester or to an augmented scan path 104, as described above, could be used as well.

Figure 2:
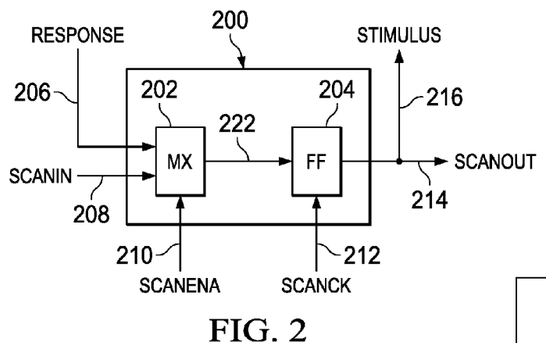
FIG. 2 is a block diagram of a scan cell.

FIG. 2 illustrates an example of a typical scan cell that may be used in scan path 104. The scan cell consists of a D flip-flop (D-FF) 204 and a multiplexer 202. During normal configuration of the circuit 100, multiplexer 202 and D-FF 204 receive control inputs SCANENA 210 and SCANCK 212 to input functional data from logic 108 via path 206 and output functional data via path 216. In the normal configuration, the SCANCK to D-FF 204 is typically a functional clock, and the SCANENA signal is set such that the D-FF always clocks in functional data from logic 108 via path 206. During the test configuration of FIG. 2, multiplexer 202 and D-FF 204 receive control inputs SCANENA 210 and SCANCK 212 to capture test response data from logic 108 via path 206, shift data from scan input path 208 to scan output path 214, and apply test stimulus data to logic 108 via path 216. In the test configuration, the SCANCK to D-FF 204 is the test clock and the SCANENA signal is operated to allow capturing of response data from logic 108 and shifting of data from scan input 208 to scan output 214. During test configuration, SCANENA is controlled by tester 110 via path 114. SCANCK may also be controlled by the tester, or it may be controlled by another source, for example a functional clock source. For the purpose of simplifying the operational description, it will be assumed that the SCANCK is controlled by the tester.

The scan inputs 208 and scan outputs 214 of multiple scan cells are connected to form the serial scan path 104. The stimulus path 216 and response path 206 of multiple scan cells in scan path 104 form the stimulus bussing path 122 and response bussing path 124, respectively, between scan path 104 and logic 108. From this scan cell description, it is seen that the D-FF is shared between being used in the normal functional configuration and the test configuration. During scan operations through scan path 104, the stimulus outputs 216 from each scan cell ripple, since the stimulus 216 path is connected to the scan output path 214. This ripple may cause all the inputs to logic 108 to actively change state during scan operations. Rippling the inputs to logic 108 causes power to be consumed by the interconnect and gating capacitance in logic 108.

Figure 3:
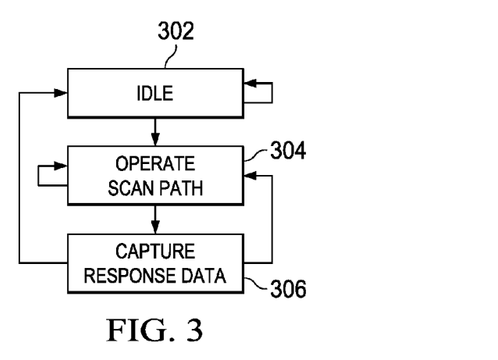
FIG. 3 is a flow diagram of the operation of the circuit of FIG. 1.

FIG. 3 illustrates a simplified example of how tester 110 may operate the scan architecture during test. Initially the tester may output control signals on path 114 to place the scan architecture in an idle state 302. Next, the tester may output control signals on path 114 to place the scan architecture in an operate scan path state 304. In the operate scan path state, the tester outputs control the scan path to cause it to accept stimulus data from the tester via path 118 and to output response data to the tester via path 120. The tester maintains the operate scan path state until the scan path has been filled with stimulus data and emptied of response data. From the operate scan path state, the tester may output control signals on path 114 to place the scan architecture in a capture response data state 306. In the capture response data state, the tester outputs control signals to cause the scan path to load response data from logic 108 via path 124. From the capture response data state 306, the tester outputs control signals on path 114 to cause the scan architecture to re-enter the operate scan path state 302. The process of entering the operate scan path state 304 to load stimulus into the scan path and empty response from the scan path, and then passing through the capture response state 306 to load new response data from logic 108 repeats until the end of test. At the end of test the tester may output control signals to cause the scan architecture to re-enter the idle state 302.

Referring back to FIG. 1, scan controller 130 may be any one of many types of scan controller circuits. Two examples of some of the types of scan controllers that could be represented by scan controller 130 are briefly discussed below.

In one realization, scan controller 130 may represent a test access port (TAP) controller circuit of IEEE standard 1149.1, A Standard Test Access Port and Boundary Scan Architecture, commonly referred to as JTAG (Joint Test Action Group). Alternatively, test port 130 may conform to IEEE 1149.7, which is a reduced pin count version of 1149.1. A brief description of JTAG 1149.1 and 1149.7 is provided by "Joint Test Action Group", Wikipedia, as of Nov. 5, 2015, which is incorporated by reference herein.

In another realization, scan controller 130 may represent a boundary input/output serializer (BIOS) circuit, described in regard to FIG. 17 of U.S. Pat. No. 5,526,365, being used to control scans access to parallel scan paths. The description in U.S. Pat. No. 5,526,365 is incorporated herein by reference. The BIOS operation also differs from the operation state diagram of FIG. 3, but in general it contains the fundamental scan 304 and capture 306 states.

In another embodiment, another known or later developed test access port design may be used.

Figure 4:
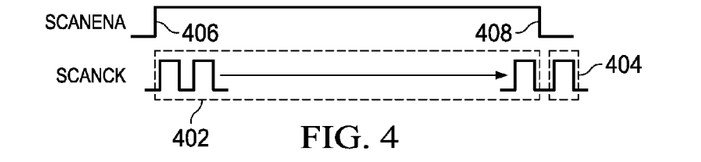
FIG. 4 is a timing diagram of one mode of operation of the circuit of FIG. 1.

FIG. 4 illustrates a timing example of how tester 110 outputs SCANENA and SCANCK signals to scan path 104 during scan operations in a conventional mode of operation. In this example, a low to high transition on SCANENA, at time 406, in combination with SCANCKs occurring during time interval 402, causes stimulus data from the tester to be input to the scan path via path 118 while response data is output from the scan path to the tester via path 120. A high to low transition on SCANENA, at time 408, in combination with a SCANCK at time 404, causes response data from logic 108 to be loaded into the scan path. Time interval 402 relates to state 304 of operating the scan path, and time interval 404 relates to state 306 of capturing a response, in FIG. 3. As seen in the timing and operation diagrams of FIGS. 3 and 4, the time interval sequences 404 (i.e. state 306) and 402 (i.e. state 304) cycle a sufficient number of times during test to input all stimulus to and obtain all response from logic 108. During each interval 404 the number of clock cycles may be just one for performing stuck-at testing, two for performing sequential at-speed testing or many for at-speed testing.

From the scan architecture described in regard to FIGS. 1, 2, 3, and 4 it is seen that the stimulus 122 outputs ripple the inputs to logic 108 as data shifts through the scan path 104 during scan operations when operated in a conventional mode of operation. Rippling the inputs of logic 108 causes simultaneous charging and discharging of capacitances associated with the interconnects and gates of logic 108. For example, each scan cell stimulus output 216 to logic 108 charges and discharges a certain amount of capacitance within logic 108 at a frequency related to the data bits being scanned through the scan cell. While each scan cell stimulus output may only be directly input to a few gates within logic 108, each of the gates in logic 108 have outputs that fanout to inputs of other gates in logic 108, and the outputs of the other gates in logic 108 again fanout to inputs of still further gates, and so on. Thus a transition on the stimulus output of a single scan cell may initiate hundreds of transitions within logic 108 as a result of the above mentioned signal transition fanout. Each of the transitions charge or discharge a portion of the total capacitance with logic 108 and therefore contribute to power consumption within logic 108.

The individual power (Pi) consumed by the rippling of a given scan cell output 216 can be approximated by $CV^2 \cdot F$, where C is the capacitance being charged or discharged by the scan cell output (i.e. the capacitance of the above mentioned signal transition fanout), V is the switching voltage level, and F is the switching frequency of the scan cell output. The total power (Pt) consumed by simultaneously scanning all the scan cells in scan path 104 is approximately the sum of the individual scan cell powers, i.e. $Pt=Pi(1)+Pi(2)+\ldots Pi(N)$. The total power consumed by circuit 100, when it is configured into the scan architecture of FIG. 1, can exceed the power consumed by circuit 100 when it is configured into its normal functional mode. This can be understood from the fact that, during normal functional mode of circuit 100, not all the D-FFs 204 simultaneously operate, as they do during scan operations occurring during the above described scan test operation. Further if an IC contained multiple circuits 100, the test of the IC may require testing each circuit 100 individually due to the above described test power consumption restriction. This lengthens the test time of the IC, which increases the cost to manufacture the IC.

A first known method of reducing power consumption during test operation is to insert blocking circuitry, such as a gate, into the stimulus paths 216 of each scan cell, such that during scan operations the inputs to logic 108 are blocked from the effect of the scan ripple. The problem with the first method is that it adds an undesirable delay (i.e. the blocking circuit delay) in the stimulus paths 216 between D-FFs 204 and logic 108. Only logic power is reduced up to certain extent while clock and sequential power remains same. The power reduction can be in the range of few percentage (e.g. <10%). This delay can negatively affect the performance of circuit 100 when it is configured into its normal functional mode. A second known method is to reduce the scan clock rate, such that the ripple frequency (F) is reduced. The problem with the second method is that it increases the test time since scan operations are performed at the reduced scan clock rate. A third method is to divide the scan chain into several segments and control the scan clock such that only one segment is clocked at a time, as described in more detail in U.S. Pat. No. 8,627,161, entitled "Low Power Divided Scan Paths with Adaptor and Scan Controller," which is incorporated by reference herein.

Today, there are a number of test synthesis vendor tools that can synthesize and insert scan architectures into ICs, similar in structure to the scan architecture shown in FIG. 1. The use of such "push-button" scan insertion tools is an attractive alternative to customized scan designs since it is an automated process. As will be described, the present disclosure provides a method of adapting these synthesized scan architectures such that they may operate in a desired low power mode. The process of adapting scan architectures for low power operation is also easily automated.

The present disclosure described below provides a method of adapting synthesized scan architectures to achieve a low power mode of operation. The process of adapting scan architectures for low power operation is achieved without the aforementioned need (1) to insert blocking circuitry in the stimulus paths which adds signal delays, (2) to decrease the scan clock rate which increases test time, or (3) to control the scan clocks to separate segments.

Figure 5:
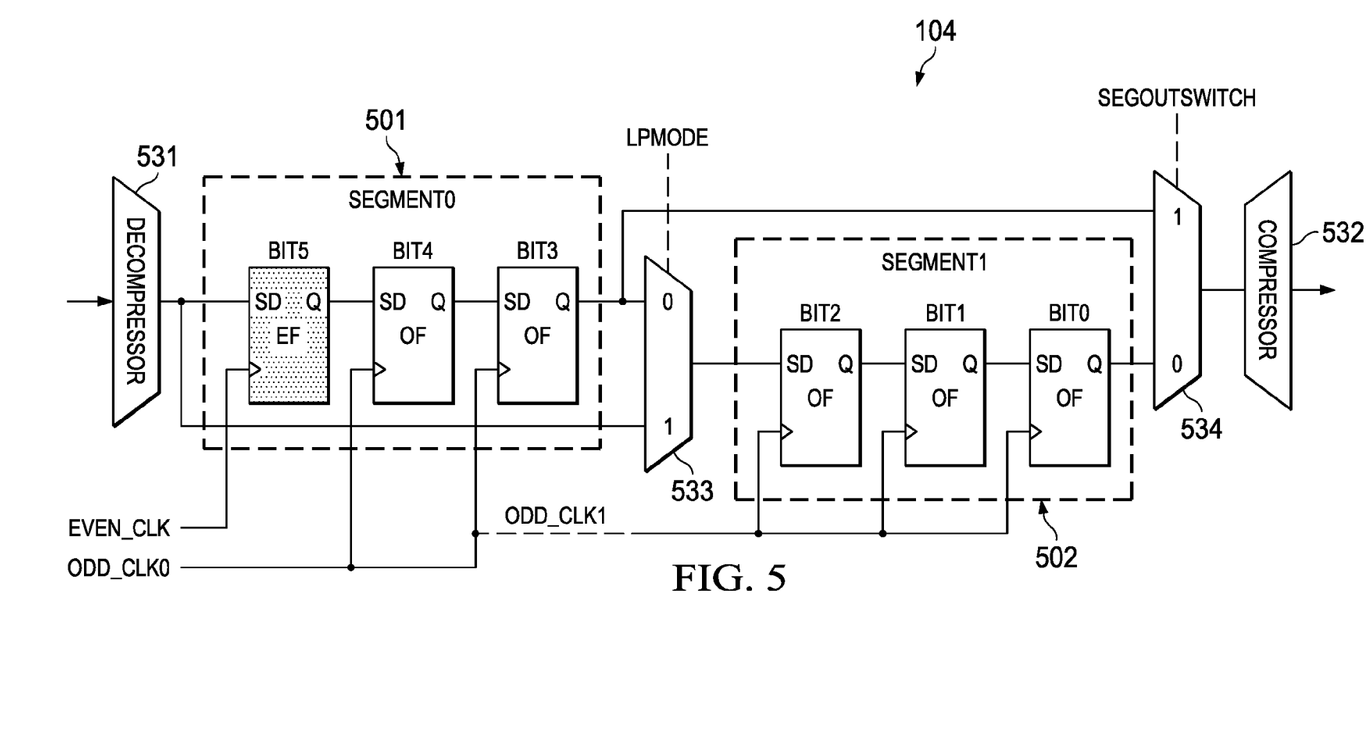
FIG. 5 is a more detailed diagram of the scan path of FIG. 1.

FIG. 5 is a more detailed diagram of the scan path of FIG. 1 in which details allowing two different modes of scan operation are illustrated. In this example, decompressor logic 531 and compressor logic 532 are part of test port 130, referring back to FIG. 1. Decompressor logic 531 receives a stream of data and control signals from an external test system, such as tester 110 in FIG. 1 and separates the stream into the different data and control paths 112, 114, and 118 illustrated in FIG. 1, based on the test protocol supported by test port 130. In a similar manner, compressor 132 receives the data paths 116 and 120 and combines them into a data stream that is provided to the external test system, such as tester 110. As described in more detail above, the protocol used to compress and decompress the test pattern data and results data may be a currently known protocol, such as IEEE 1149.1, 1149.7, BIOS, etc., or a later developed protocol.

In this example of scan chain 104 only six flip flops are illustrated for simplicity. Typically, a scan chain may contain several dozen, several hundred, or even several thousand flip flops. Typically, a long chain may be divided into several smaller chains that are then each coupled to decompressor 531 and compressor 532 and operate in parallel.

In this example, scan chain 104 is divided into segments 501, 502. Mode multiplexor 533 has on output coupled to the input of segment 502 and is coupled to receive an output from segment 501 and an output from decompressor 531. A control signal LPMODE (low power mode) allows scan chain to operate in either a standard mode or a low power mode. A clock signal is provided to each flip flop in the chain that acts as the normal system clock when the device is operating in application mode, and acts as the scan clock when the device is in test mode. In this example, a clock signal referred to as "odd_clk0" is connected to flip flop bit3 and bit4 of segment 501. A second clock "odd_clk1" is connected flip flops bit0-2 of segment 502. As discussed above, only a few flips flops are illustrated. Typically a larger number of flips flops will be included in each segment. The number of individual clock signals may be determined by fan out rules of the clock drivers and other design constraints. Flip flop bit5, which is the head of segment 501, is clocked by clock signal "even_clk" that is out of phase with the odd clock signals. Segment output multiplexor 534 is configured to provide either the output of segment 501 or the output of segment 502 to compressor logic 532.

In standard mode, input 0 of multiplexor 533 is selected and segment 501 and segment 502 are connected in series. Input 0 of multiplexor 534 is selected and the output of segment 502 is provided to compressor 534. In this mode, the scan chain operates as a traditional scan chain.

When configured to operate in low power mode, the frequency of the scan clock may be divided by two so that the scan chain segments operate a lower speed and therefore less power is dissipated due to signal switching caused by the rippling of the test pattern through the scan chain, as discussed above in more detail. Input 1 of multiplexor 533 is selected by the LPMODE control signal and the output from the decompressor is connected to the input of segment 502. Multiplexor 534 is toggled in order to alternatively select the output from segment 501 and then the output from segment 502 to provide to compressor logic 534.

Figure 6:
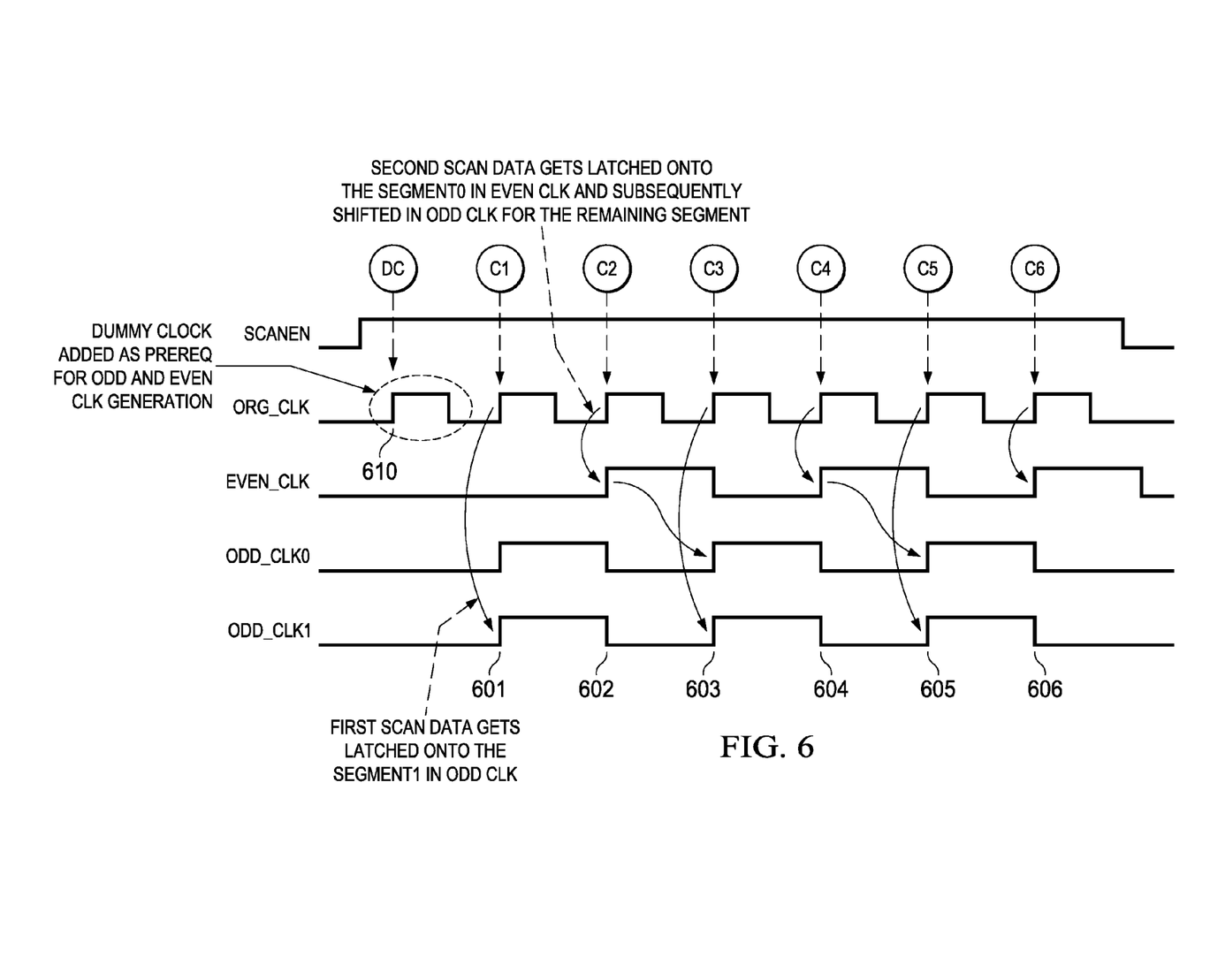
FIG. 6 is a timing diagram illustrating operation of the scan path of FIG. 5 in low power mode.

FIG. 6 is a timing diagram illustrating operation of the scan path of FIG. 5 in low power mode. The even clock and odd clock Oil signals may be derived from the device's original clock "org_clk" to form clock signals operating at half the frequency of org_clk. Also, the even clock signal is 180 degrees out of phase from the odd clock 0/1 signals. A ring counter circuit may be used to produce the out of phase clock signals from the original clock signal, for example. While a 180 degree phase shift is illustrated here and is easy to produce, other phase shifts may also be used, such as 90 degrees, for example.

In this example, a scan sequence begins with a dummy cycle 610 that begins the generation of the odd and even clock signals. A first "odd" bit of the test pattern is latched 601 into the first flip flop bit2 of segment 502 by the odd clock. A second scan "even" bit is then latched 602 into the first flip flop bit 5 of segment 501 by the even clock and then subsequently shifted for the remainder of segment 501 by the odd clock. This is repeated for even edges 604, 606 and odd edges 603, 605 until both segment 501 and 502 are filled with a new pattern. At the same time, result data that was residing in segments 501, 502 is shifted out through multiplexor 534 and provided to concentrator logic 532 and then to external tester 110, referring back to FIG. 1.

In this manner, the test pattern and results data is only rippled through one segment that is half of the scan chain. Thus, the power dissipation caused by the rippling data is essentially reduced by half.

Figure 7:
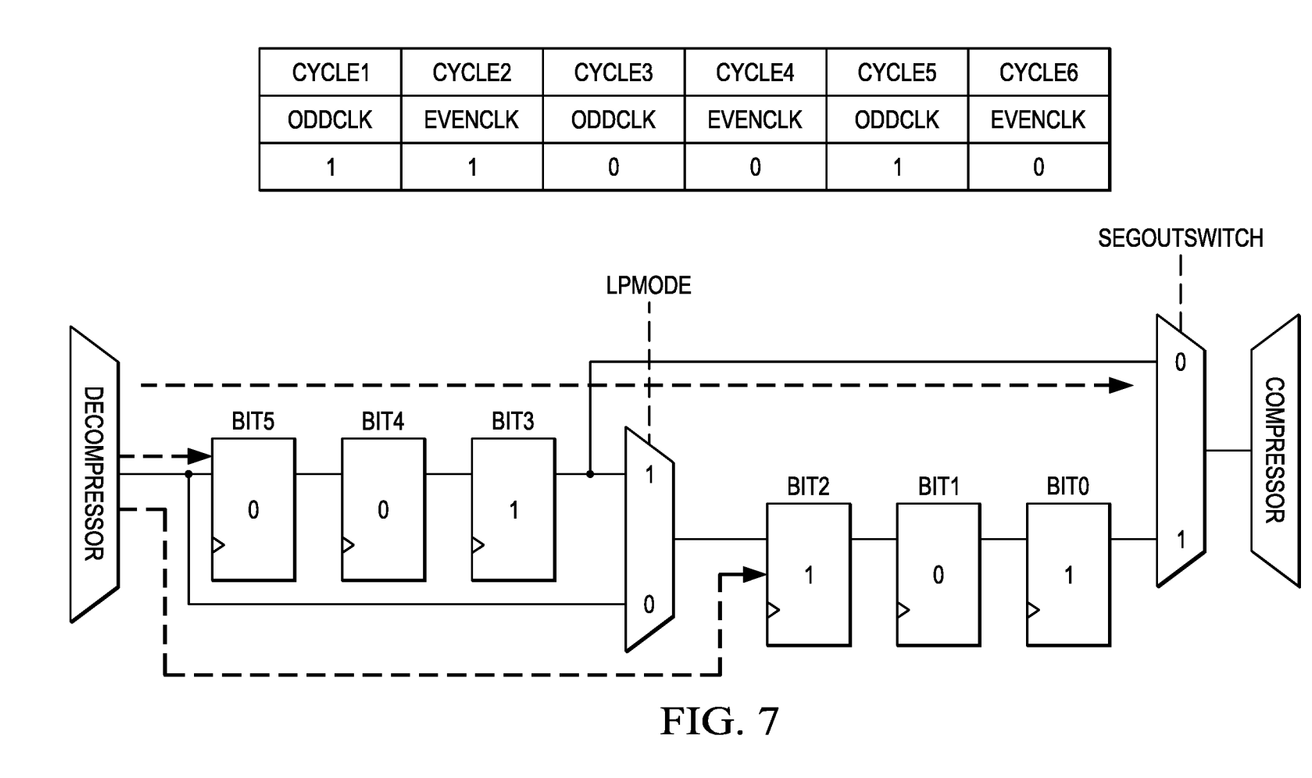
FIG. 7 illustrates how a test pattern is shifted into the scan chain of FIG. 5.

FIG. 7 illustrates how a test pattern is shifted into the scan chain of FIG. 5. Due to the manner in which the test pattern is divided between the two segments 501, 502, the test pattern needs to be "scrambled" prior to shifting into the scan chain. Bits that are intended for "odd" segment 502 need to be merged with bits intended for "even" segment 501. For example, if the automatic test pattern generation (ATPG) tool determines that a pattern of 101100 is needed to test the logic that is coupled to scan chain 104, the pattern must first be scrambled to a pattern of 110010. Table 1 illustrates the scrambling process. This example assumes bit0 of the test pattern is shifted in first, from left to right.

TABLE 1

Test Pattern Scrambling Sequence

| ATPG bit order | Bit0 | Bit1 | Bit2 | Bit3 | Bit4 | Bit5 |
|---|---|---|---|---|---|---|
| | 1 | 0 | 1 | 1 | 0 | 0 |
| Scrambled bit order | Bit0 | Bit3 | Bit1 | Bit4 | Bit2 | Bit5 |
| | 1 | 1 | 0 | 0 | 1 | 0 |
| After shifting into scan chain | Bit5 | Bit4 | Bit3 | Bit2 | Bit1 | Bit0 |
| | 0 | 0 | 1 | 1 | 0 | 1 |

Figure 8:
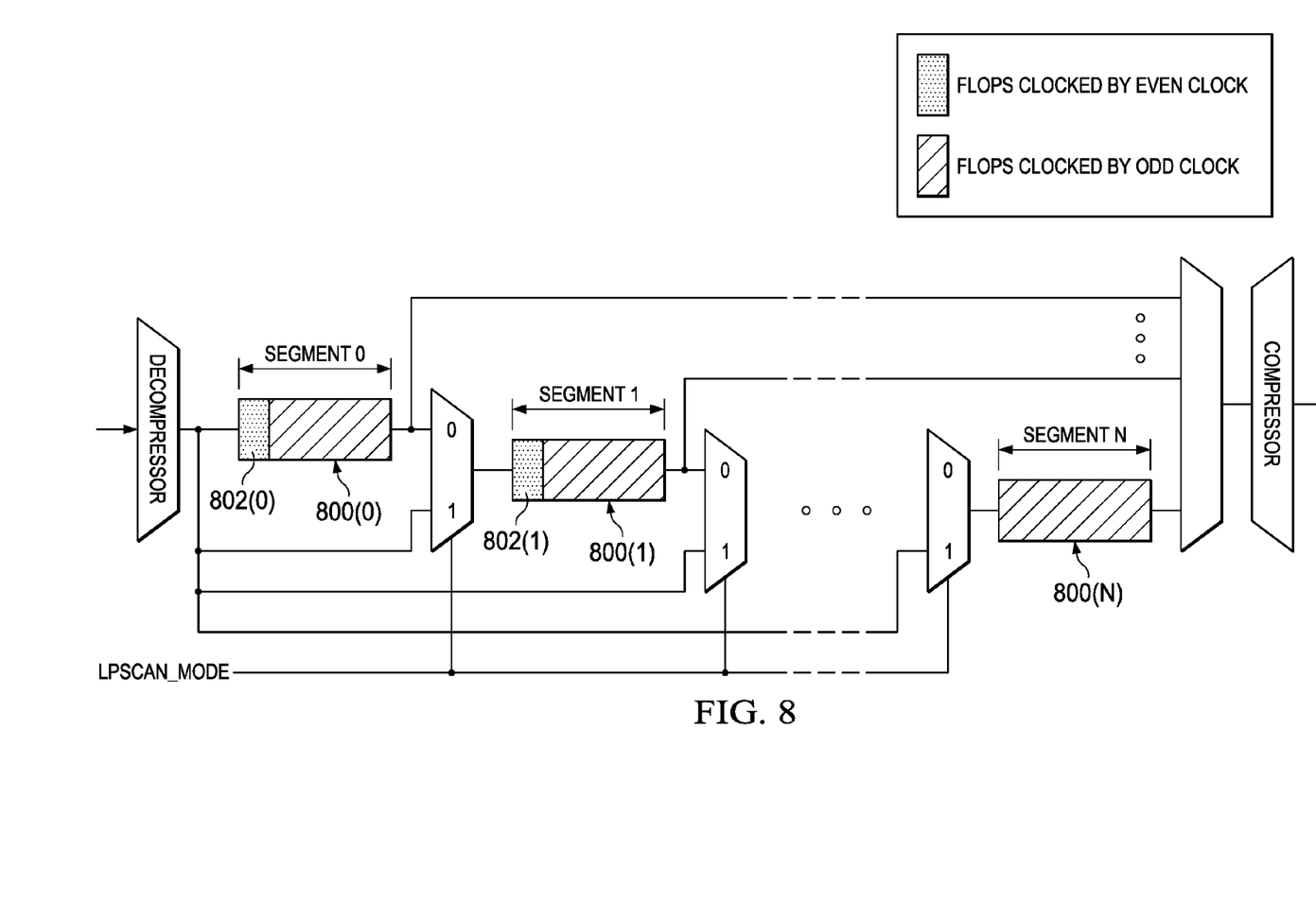
FIG. 8 is a block diagram illustrating division of a scan path into more than two segments.

FIG. 8 is a block diagram illustrating division of a scan path into more than two segments. The FSS scan solution can be scaled to have N segments where N=2"n (n=0, 1, 2, 3 . . . ). The internal clock to the segments in each case would be "divided by N" of the original scan clock. Except for the Nth segment, the head element of all the remaining segments would be clocked by the even clock with the remaining portion of the segment clocked by the odd clock. For example, the head element 802(0)-802(N-1) of segments 800(0)-800(N-1) would be clocked by an even clock, while the remainder of each segment 800(0)-800(N-1) and all of segment 800(N) would be clocked by an odd clock.

In this manner, N segments would be operating at 1/N the original scan clock frequency. Each test pattern bit would be rippled through only 1/N bit positions, thereby reducing power dissipation by approximately 1/N.

Figure 9:
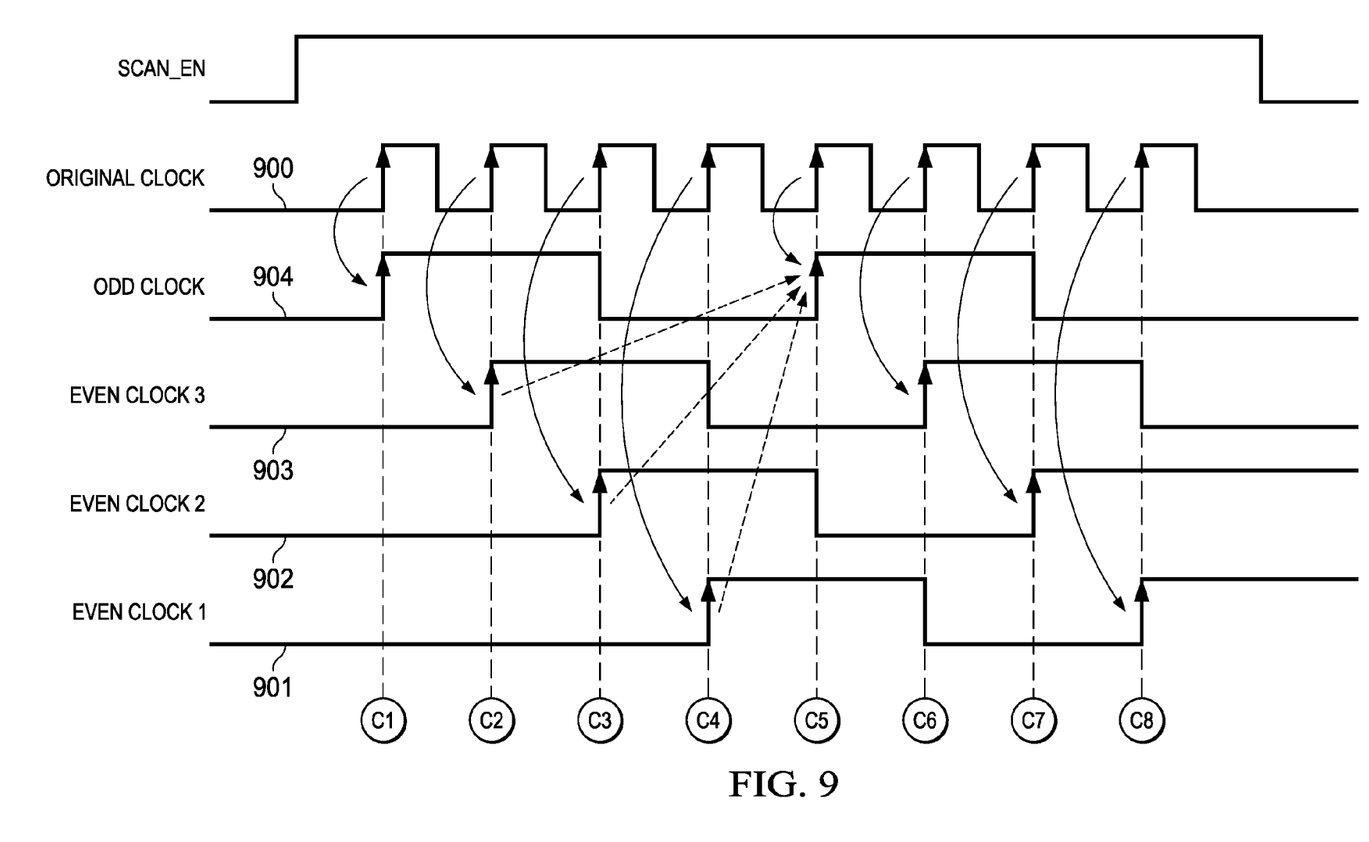
FIG. 9 is a timing diagram illustrating operation of the scan path of FIG. 8.

FIG. 9 is a timing diagram illustrating operation of the scan path of FIG. 8. In this example, assume N=4. The original scan clock 900 produces an odd clock 904 that has a frequency of ¼ that of original scan clock 900. Three even clock phases 901, 902, and 903 are produced that are each offset by one period of original scan clock 900. Even clock 901 is provided to the head element 802(0) of segment 800(0), referring back to FIG. 8, while the odd clock 904 is provided to the remainder of segment 800(0). Similarly, even clock 902 is provided to the head element 802(1) of segment 800(1), while the odd clock 904 is provided to the remainder of segment 800(1). Similarly, even clock 903 is provided to the head element 802(2) of segment 800(2), while the odd clock 904 is provided to the remainder of segment 800(2). Odd clock 904 is provided to all flip flop elements of last segment 800(N).

Figure 10:
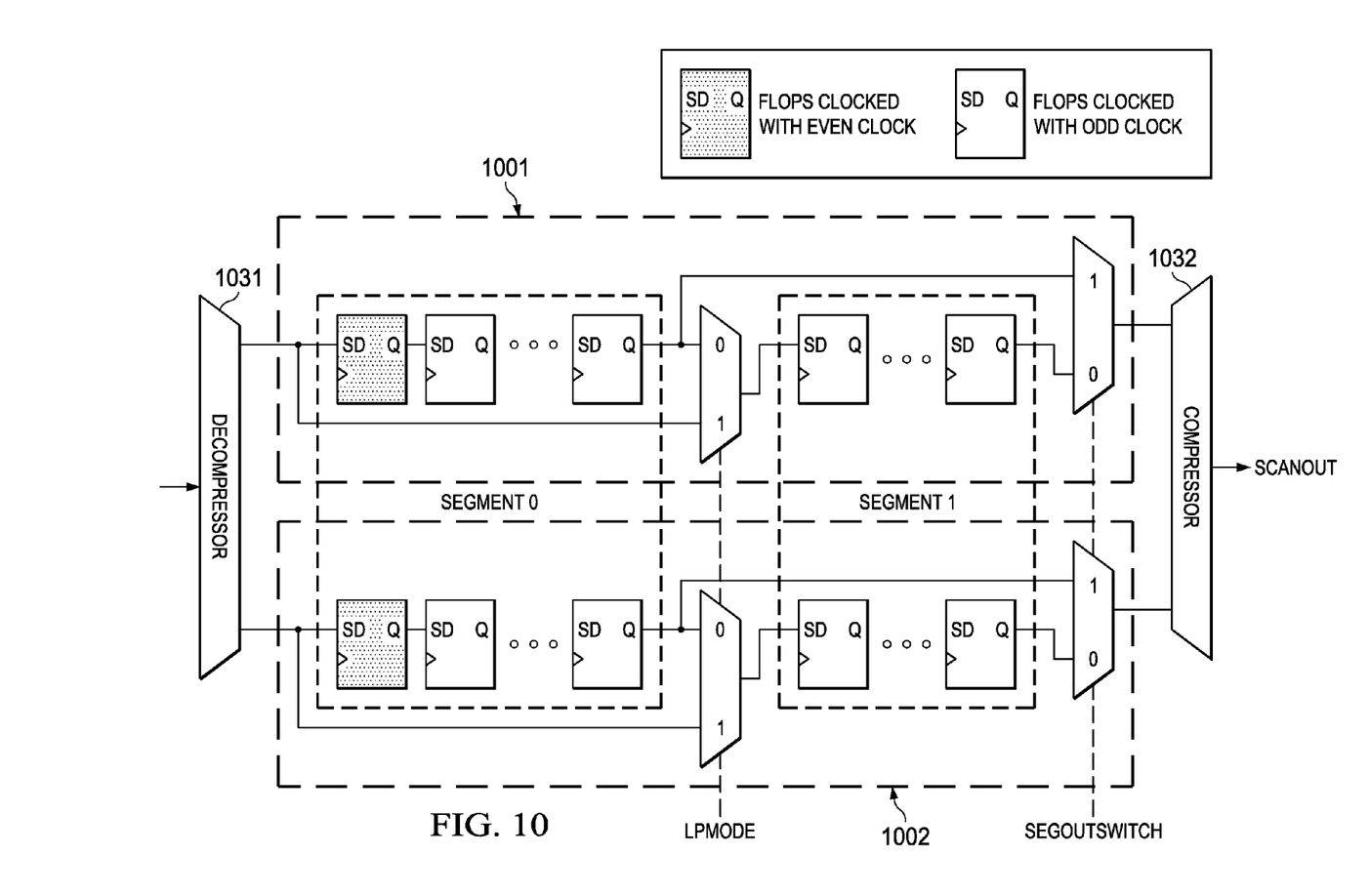
FIG. 10 is a block diagram of a scan chain illustrating multiple parallel segment paths.

FIG. 10 is a block diagram of a scan chain illustrating multiple parallel segment paths 1001, 1002. Paths 1001, 1002 are referred to herein as "stumps". While two stumps are illustrated here, a large number of stumps may be implemented in a given IC. In this case, decompressor 1031 breaks an incoming stream of test pattern data into multiple streams that are then provided to each of the stumps. Similarly, compressor 1032 multiplexes the result data received from the multiple stumps into a single stream that may then be provided to the external tester.

For example, consider a design 'X' with ~80 Flops, the scan insertion is performed with the constraint [Max scan chain length=(Actual stump length)/2]. In this case, given a stump of length of 8, scan insertion is done with max scan chain length constraint as 4. This would result in scan insertion tool stitching 20 chains. During codec (compressor/decompressor) hook-up, the consecutive chains are identified as segment0 & segment1 respectively and are concatenated to form a single chain of length eight, thereby making the entire scan chain to be ten chains as seen by the codec.

The additional multiplexing logic, such as mux 533, 534, may be inserted during codec hook-up.

In another example, consider an unbalanced Scan Chain. Consider a design 'X' with ~78 Flops. By performing scan insertion with max scan chain length=4, and concatenating subsequent chains (as seg0 & seg1) to form 10 chains would result in the last chain having just 6 flops. In this case there are two possible options: Case 1: Segment 0 has four Flops, while Segment 1 has two Flops; Case 2: Segment 0 has two Flops, while Segment 1 has four Flops. In case 1 scenario, there is a loss of scan data loaded into the chain (two valid scan-in bits lost). Since this cannot be resolved through pattern/design modification, this method of chain partitioning is not recommended. In the Case 2 scenario, the mismatch is seen only on the scan-unload value. This can be easily resolved by tweaking the pattern modification script to augment the scan-in bit values of the subsequent pattern in reordering the scan-unload value for the current pattern.

Figure 11:
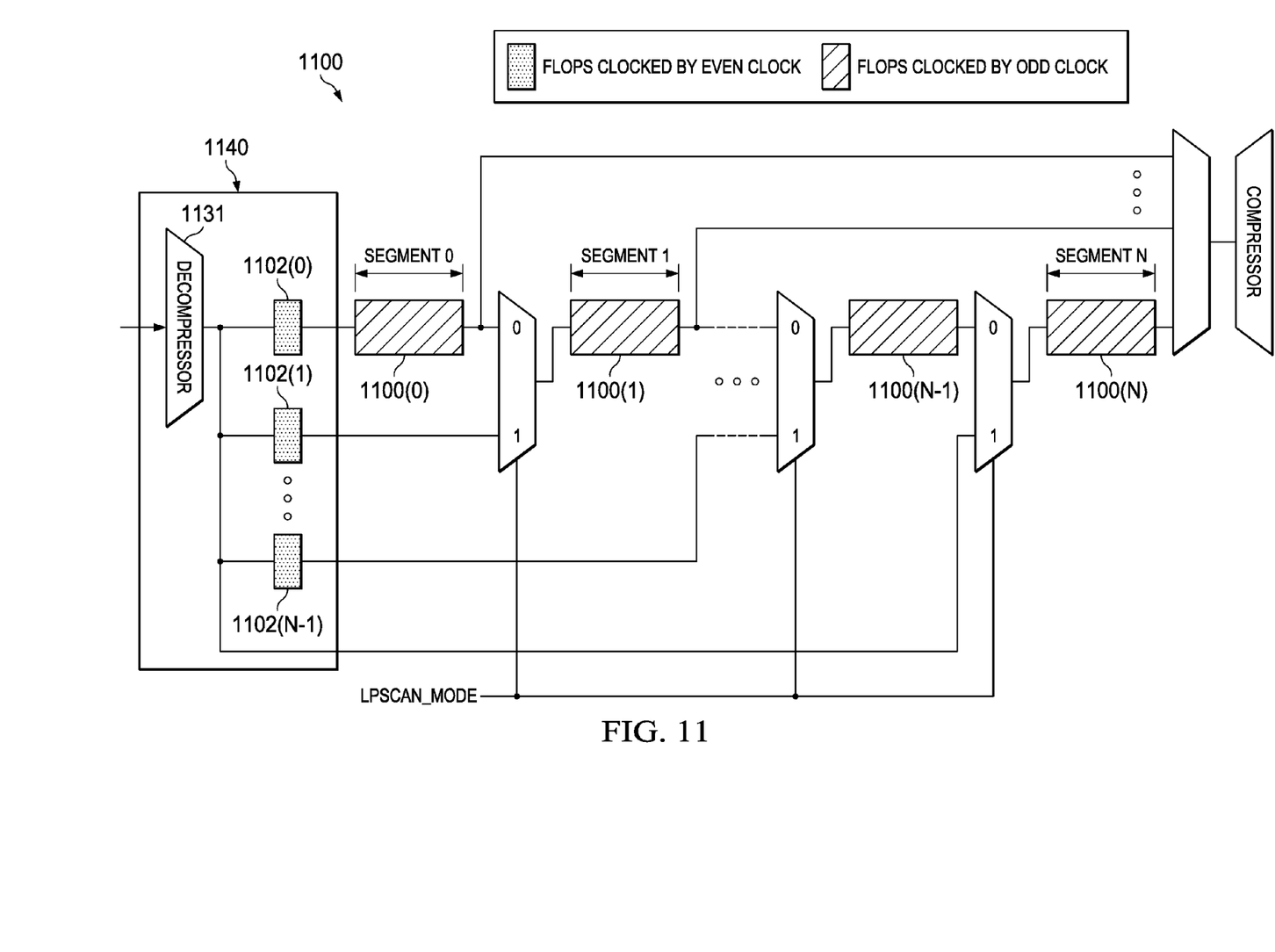
FIG. 11 is a block diagram of a scan chain illustrating multiple serial paths with more than two segments.

FIG. 11 is a block diagram of a scan chain 1100 illustrating an alternative embodiment. In this example, the head elements 1102(0)-1102(N-1) are separated from their respective segments 1100(0)-1100(N-1) and gathered together in a logic block 1140 with decompressor 1131. In this manner, the routing of the even clock signals may be simplified since they are confined to a single area in logic block 1140. Since the head elements are now separated from the scan chain segments, the test patterns would need to be further modified to insert "don't care" values for the data bits that end up in the head elements after scan shifting.

Figure 12:
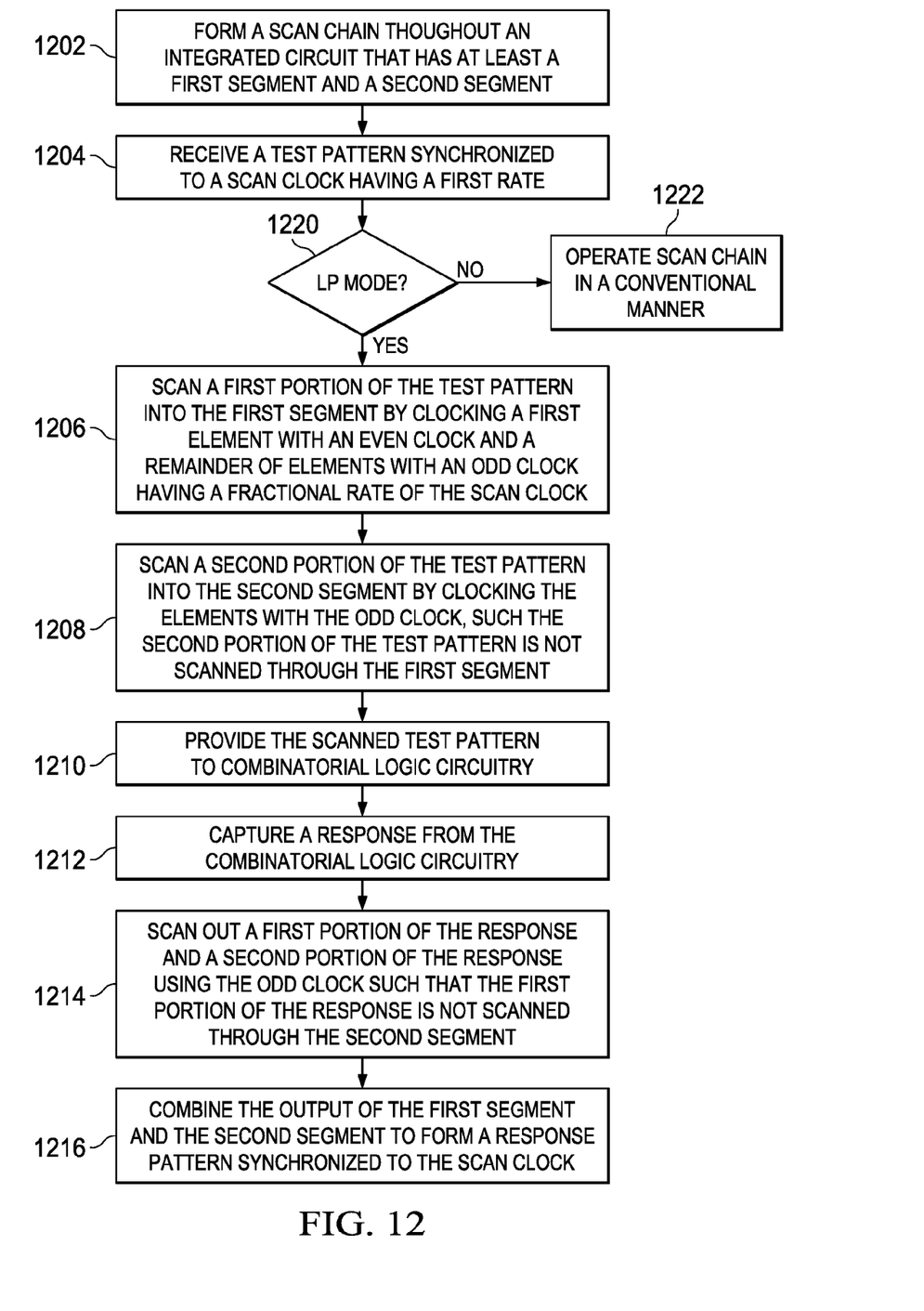
FIG. 12 is a flow diagram illustrating operation of a scan chain.

FIG. 12 is a flow diagram illustrating operation of a scan chain as described above in more detail. The scan chain may be internal to an integrated circuit and be used to test various blocks of logic in the integrated circuit.

A scan chain is formed 1202 throughout the integrated circuit in which the scan chain includes at least a first segment and a second segment each having a plurality of scan cells. The scan cells may be of various known or later developed clock state saving elements, such a D flip flops, RS flip flops, JK flip flops, T flip flops, etc.

A test pattern is received 1204 by a test port on the IC for the scan chain, in which the test pattern is synchronized to a scan clock having a first rate.

During a low power mode of operation 1220, a first portion of the test pattern is scanned 1206 into the first segment by clocking a first flip-flop of the first segment with an even clock while clocking a remainder of the plurality of flip-flops in the first segment with an odd clock. The odd clock is out of phase with the even clock. The even clock and odd clock have a second rate equal to the first rate divided by an integer N.

During the low power mode of operation 1220, the second segment is coupled directly to the test port to receive the test pattern while bypassing the first segment. This may be done using a multiplexor such as mux 533 in FIG. 5, for example. A second portion of the test pattern is scanned 1208 into the second segment by clocking the plurality of flip-flops in the second segment with the odd clock, such that the second portion of the test pattern is not scanned into the first segment.

The first portion and second portion of the test pattern is then presented 1210 to combinatorial logic circuitry coupled to the first segment and the second segment.

A response is captured 1212 from the combinatorial logic circuitry in the first segment and the second segment that represents the combinatorial results of the logic circuitry.

A first portion of the response is scanned out 1214 from the first segment and a second portion of the response from the second segment using the odd clock, such that the first portion of the response is not scanned through the second segment.

The output of the first segment and the output of the second segment is combined 1216 to form a response pattern synchronized to the clock having the first rate. As described in more detail above, the output of the first segment and the second segment may be interleaved to by toggling a multiplexor such as mux 534, referring back to FIG. 5.

During a conventional mode of operation 1220, multiplexor 533 may be configured 1222 to couple a first element of the second segment to a last element of the first segment to form a contiguous chain. In this mode, a test pattern may be scanned from the test port to the first segment and then to the second segment by clocking the first segment and the second segment at a rate equal to the scan clock.

In this manner, test patterns may be developed for an integrated circuit using standard ATPG tools. The patterns may then be scrambled using a simple scramble technique in order to allow low power scan chain operation.

Table 2 illustrates an example in which there are approximately sixty-six scan paths that each have approximately 80 flops organized in two segments.

TABLE 2 example test results

| Mode | Scan Frequency | Internal Scan Frequency | Total Test Time (µs) | Total Power (Max Sliding Window) mw |
|---|---|---|---|---|
| DEFAULT | 50 MHz | 50 MHz | 641 | 52.68 |
| LPSCAN | 50 MHz | 25 MHz | 641 | 29.72 |
| LPSCAN | 100 MHz | 50 MHz | 321 | 60.61 |

In the example of Table 2, for the same scan-frequency, without any impact to test-time, there is approximately 44% reduction in scan power. Alternatively, a self test may be run at 2x the normal scan frequency resulting in ~50% test-time reduction with a marginal increase in scan power.

Other Embodiments

While the invention has been described with reference to illustrative embodiments, this description is not intended to be construed in a limiting sense. Various other embodiments of the invention will be apparent to persons skilled in the art upon reference to this description. For example, while "flip flops" were used to describe the elements of a scan chain, various types of state saving circuitry may also be used as an element in a scan chain. For example, the following types of flip flops are typical: D type, JK, RS, T (toggle), etc.

While the remainder of the first segment is illustrated herein as being clocked by an odd clock, in another embodiment the entire first segment may be clocked by the even clock, or some other percentage of the first segment.

Certain terms are used throughout the description and the claims to refer to particular system components. As one skilled in the art will appreciate, components in digital systems may be referred to by different names and/or may be combined in ways not shown herein without departing from the described functionality. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple"

and derivatives thereof are intended to mean an indirect, direct, optical, and/or wireless electrical connection. Thus, if a first device couples to a second device, that connection may be through a direct electrical connection, through an indirect electrical connection via other devices and connections, through an optical electrical connection, and/or through a wireless electrical connection.

Although method steps may be presented and described herein in a sequential fashion, one or more of the steps shown and described may be omitted, repeated, performed concurrently, and/or performed in a different order than the order shown in the figures and/or described herein. Accordingly, embodiments of the invention should not be considered limited to the specific ordering of steps shown in the figures and/or described herein.

It is therefore contemplated that the appended claims will cover any such modifications of the embodiments as fall within the true scope and spirit of the invention.

What is claimed is:

1. A method for testing an integrated circuit, the method comprising:
    forming a scan chain throughout the integrated circuit in which the scan chain includes at least a first segment and a second segment each having a plurality of scan cells;
    receiving a test pattern for the scan chain at a test port on the integrated circuit, in which the test pattern is synchronized to a scan clock having a first rate;
    scanning in a first portion of the test pattern from the test port into the first segment by clocking a first scan cell of the first segment with an even clock while docking a remainder of the plurality of scan cells in the first segment with an odd clock, in which the odd dock is out of phase with the even dock, in which the even dock and the odd clock have a second rate equal to the first rate divided by an integer N;
    coupling the second segment to the test port to receive the test pattern while bypassing the first segment during a first mode of operation; and
    scanning in a second portion of the test pattern from the test port into the second segment by clocking the plurality of scan cells in the second segment with the odd clock, such that the second portion of the test pattern is not scanned into the first segment.

2. The method of claim 1, further including:
    providing the first portion and second portion of the test pattern to combinatorial logic circuitry coupled to the first segment and the second segment;
    capturing a response to the test pattern from the combinatorial logic circuitry in the first segment and the second segment;
    scanning out a first portion of the response from the first segment and a second portion of the response from the second segment using the odd clock, such that the first portion of the response is not scanned through the second segment; and
    combining the output of the first segment and the output of the second segment to form a response pattern synchronized to the scan clock having the first rate.

3. The method of claim 1, in which the first scan cell is dedicated to test usage while a remainder of the first segment and the second segment provide state storage for operation of the integrated circuit.

4. The method of claim 1, during a second mode of operation,
    coupling a first element of the second segment to a last element of the first segment to form a contiguous chain; and
    scanning in a third portion of the test pattern from the test port to the first segment and the second segment by clocking the first segment and the second segment at a rate equal to the scan dock.

5. The method of claim 1, further including a plurality of scan chains each having at least a first segment and a second segment, in which the plurality of scan chains are coupled in parallel to the test port.

6. An integrated circuit comprising: a test port operable to receive test patterns synchronized to a scan clock having a first rate from an external tester and to provide test results to the external tester; application logic that includes combinatorial logic interconnected with storage elements, in which a plurality of the storage elements are scan cells coupled to form a scan chain having at least a first segment and a second segment, in which a segment mode multiplexor is positioned between the first segment and the second segment such that a first scan cell of the second segment can be selectively coupled to a last scan cell of the first segment or directly to the test port in parallel with the first segment; and in which a first scan cell of the first segment is coupled to receive a test pattern from the test port, in which the first scan cell is clocked with an even clock while a remainder of the plurality of scan cells in the first segment and in the second segment are clocked with an odd clock, in which the odd clock is out of phase with the even clock, in which the even clock and the odd clock have a second rate equal to the first rate divided by an integer N.

7. The integrated circuit of claim 6, further including a segment output multiplexor configured to selectively couple the last scan cell of the first segment and a last scan cell of the second segment to the test port.

8. The integrated circuit of claim 6, in which the scan chain is organized as a plurality of parallel scan chain stumps in which each scan chain stump has a least a first segment and a second segment, in which a multiplexor is positioned between the first segment and the second segment of each scan chain stump such that a first scan cell of the second segment can be selectively coupled to a last scan cell of the first segment or directly to the test port in parallel with the first segment, in which the first scan cell of each first segment is clocked with the even clock while a remainder of the plurality of scan cells in the first segment and in the second segment are clocked with the odd clock.

9. The integrated circuit of claim 6, in which the first scan cell of the first segment is dedicated to test usage and is not interconnected with the combinatorial logic.

10. The integrated circuit of claim 9, in which a first scan cell of the first segment is clocked by the even clock, while the remaining cells of the first segment and the second segment are clocked by the odd clock, wherein the odd clock is also used during normal operation of the integrated circuit.

11. The integrated circuit of claim 6, in which the scan chain includes N segments each separated by a respective segment mode multiplexor, in which a first scan cell of all but a last one of the N segments is clocked by the even dock while the remainder of the scan cells are clocked by the odd clock; and
    in which the respective segment mode multiplexors are each configured to couple the first scan cell of each segment after the first segment directly to the test port in a first mode of operation, and to couple the first scan cell of a segment to a last scan cell of a preceding segment in a second mode of operation.

12. A method for testing an integrated circuit, the method comprising: developing a set of test patterns for the integrated circuit (IC) using an automatic test pattern generation (ATPG) tool; configuring a scan chain on the IC as a conventional scan chain and verifying operation of the set of test patterns; scrambling the test patterns to merge test bits for an odd segment with test bits for an even segment; and scanning the scrambled test patterns into the IC using an odd clock and an out of phase even clock to separate the merged test bits into the odd segment and the even segment.

* * * * *